United States Patent
Cho (10) Patent No.: US 12,519,441 B2
(45) Date of Patent: Jan. 6, 2026

(54) METHOD FOR ACOUSTIC ADJUSTMENT USING A LOUDNESS VALUE AND A CLIPPING OCCURRENCE RATE OF A TEST SOUND SOURCE

(71) Applicant: Panasonic Intellectual Property Management Co., Ltd., Osaka (JP)

(72) Inventor: Daiki Cho, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 209 days.

(21) Appl. No.: 18/225,922

(22) Filed: Jul. 25, 2023

(65) Prior Publication Data

US 2025/0038725 A1    Jan. 30, 2025

(51) Int. Cl.
*H04R 3/04* (2006.01)
*H03G 3/30* (2006.01)
*H03G 5/16* (2006.01)

(52) U.S. Cl.
CPC ............ *H03G 3/3036* (2013.01); *H03G 5/165* (2013.01); *H04R 3/04* (2013.01); *H03G 2201/103* (2013.01); *H04R 2430/01* (2013.01)

(58) Field of Classification Search
CPC ........ H03G 3/20; H03G 3/3036; H03G 5/165; H04R 3/04; H04R 2430/01
See application file for complete search history.

(56) References Cited

U.S. PATENT DOCUMENTS

| | | |
|---|---|---|
| 2010/0215193 A1 | 8/2010 | Wihardja et al. |
| 2011/0038490 A1 | 2/2011 | Yang et al. |
| 2014/0205111 A1 | 7/2014 | Hatanaka et al. |
| 2016/0183000 A1 | 6/2016 | Katsianos et al. |
| 2023/0060353 A1* | 3/2023 | Gandhi ............ G10K 11/17855 |

FOREIGN PATENT DOCUMENTS

JP     2002-151975     5/2002

OTHER PUBLICATIONS

Extended European Search Report issued Dec. 19, 2024 in corresponding European Patent Application No. 24190084.4.

* cited by examiner

*Primary Examiner* — James K Mooney
(74) *Attorney, Agent, or Firm* — Wenderoth, Lind & Ponack, L.L.P.

(57) ABSTRACT

An arithmetic device executes a method for acoustic adjustment including: setting an initial value of a gain value of a preamplifier based on a difference between energies of the test sound source before and after correction by an equalizer to an input sound; amplifying a volume of the test sound source by the preamplifier using the initial value, calculating a loudness value and a clipping occurrence rate of the test sound source corrected by the equalizer, and determining whether calculation results of the loudness value and the clipping occurrence rate are each less than a predetermined threshold; and reducing the initial value of the gain value by a specified value in a case where the calculation result of the loudness value or the clipping occurrence rate is equal to or greater than the predetermined threshold.

6 Claims, 7 Drawing Sheets

METHOD FOR ACOUSTIC ADJUSTMENT USING A LOUDNESS VALUE AND A CLIPPING OCCURRENCE RATE OF A TEST SOUND SOURCE

BACKGROUND OF THE INVENTION

1. Field of the Invention

The present disclosure relates to a method for acoustic adjustment.

2. Background of the Art

A seat of an aircraft is provided with a monitor on which a passenger can watch a movie, listen to music, play a game, check a flight situation, and the like. In such a monitor for an aircraft, a speaker is not used in order to avoid sound leakage to a peripheral seat, and a device such as a headphone or an earphone is used in most cases. Hereinafter, a device such as a headphone or an earphone is collectively referred to as a headphone. Since all passengers do not always carry headphones into the aircraft, the airline company distributes headphones to the passengers. However, headphones distributed to passengers, particularly, of the economy class are inexpensive, and there is room for improvement in a sound quality of the headphones. In order to improve the sound quality of the headphone, there is known a technique of generating an equalizer in accordance with acoustic characteristics of the headphone and correcting the acoustic characteristics. However, sound cracking or a decrease in volume feeling caused by the equalizer may occur in some cases. Hereinafter, sound cracking is described as clipping.

SUMMARY OF THE INVENTION

The present disclosure provides a method for acoustic adjustment capable of improving a sound quality by an equalizer while preventing occurrence of clipping and decrease in volume feeling.

The present invention provides a method for acoustic adjustment, which is executed by an arithmetic device including at least a preamplifier and an equalizer, the method including: setting an initial value of a gain value of the preamplifier based on a difference between energy, to an input test sound source, of the test sound source before correction by the equalizer and energy, to the test sound source, of the test sound source after correction by the equalizer; amplifying a volume of the test sound source by the preamplifier using the initial value, calculating a loudness value and a clipping occurrence rate of the test sound source in a case where a frequency characteristic of the test sound source is corrected by the equalizer, and determining whether a calculation result of the loudness value is less than a first threshold and whether a calculation result of the clipping occurrence rate is less than a second threshold; and reducing the initial value of the gain value by a specified value in a case where the calculation result of the loudness value is equal to or greater than the first threshold or the calculation result of the clipping occurrence rate is equal to or greater than the second threshold.

According to the present disclosure, it is possible to improve the sound quality by the equalizer while preventing the occurrence of clipping and decrease in the volume feeling.

DETAILED DESCRIPTION OF THE EXEMPLARY EMBODIMENT

Hereinafter, embodiments specifically disclosing a method for acoustic adjustment according to the present disclosure will be described in detail with reference to the drawings as appropriate. However, more detailed description may be omitted. For example, a detailed description of a well-known matter and a redundant description of substantially the same configuration may be omitted. This is to avoid unnecessary redundancy of the following description and to facilitate understanding of those skilled in the art. The accompanying drawings and the following description are provided for those skilled in the art to fully understand the present disclosure, and are not intended to limit the subject matter described in the claims.

First Embodiment

Hereinafter, a first embodiment will be described with reference to FIGS. 1 to 7.

1-1. Configuration

[1-1-1. Configuration Example of Acoustic Reproduction Device]

Figure 1:
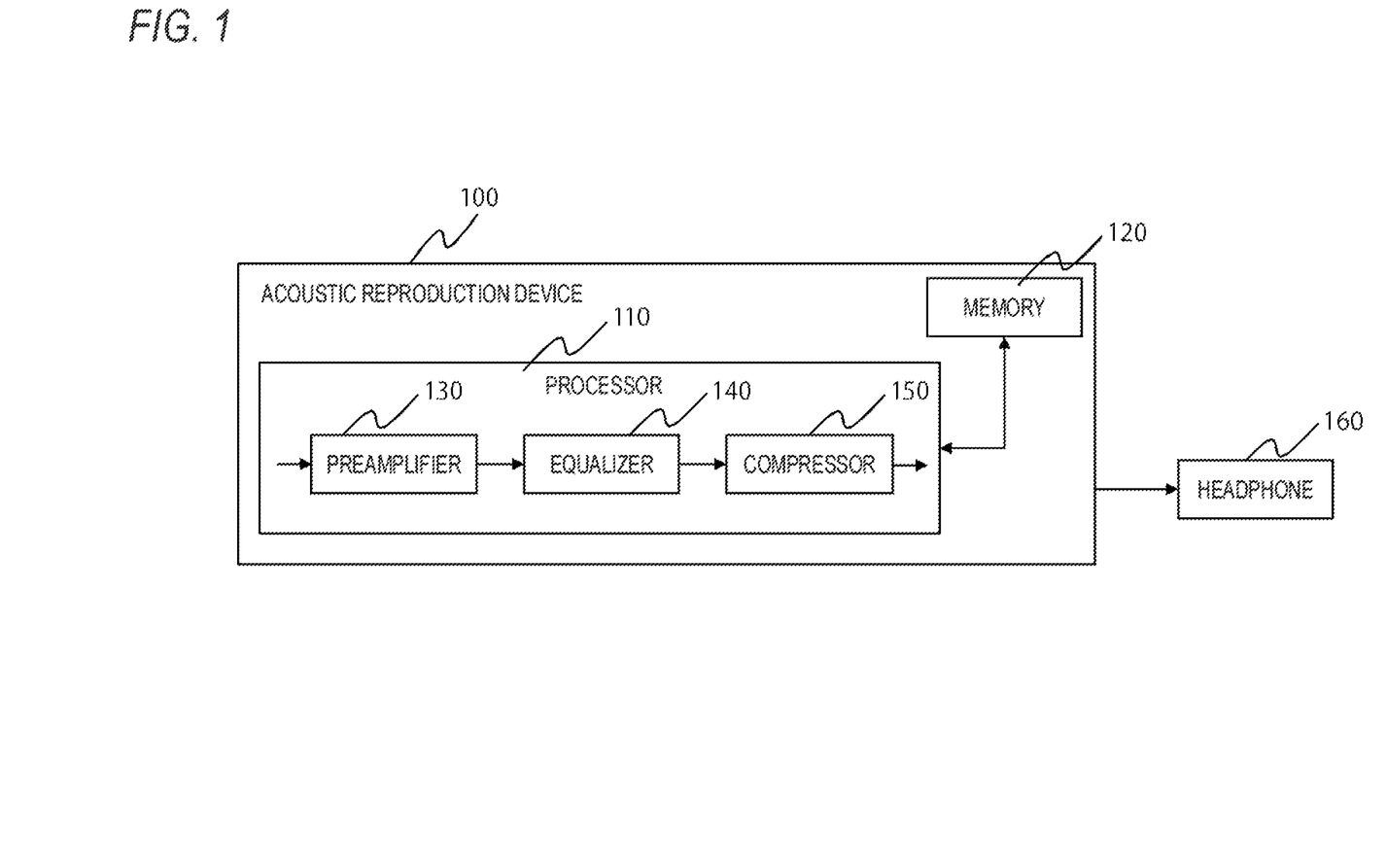
FIG. 1 is a block diagram showing a configuration example of an acoustic reproduction device according to a first embodiment.

A configuration example of an acoustic reproduction device 100 according to the first embodiment will be described with reference to FIG. 1. FIG. 1 is a block diagram showing the configuration example of the acoustic reproduction device 100 according to the first embodiment.

The acoustic reproduction device 100 is a device capable of reproducing sounds such as a movie and music. The acoustic reproduction device 100 is, for example, a seat monitor provided in a cabin such as a private room in an aircraft or at a rear surface portion of a seat for each passenger of such as an economy class. However, the acoustic reproduction device 100 is not limited to a seat monitor. The acoustic reproduction device 100 includes at least a processor 110 and a memory 120. The acoustic reproduction device 100, assuming to be used by a passenger during boarding, may be inserted with a plug of a headphone 160 disposed in a cabin or at a seat of the passenger. That is, the acoustic reproduction device 100 includes a jack into which the plug of the headphone 160 may be inserted. In order to simplify the description, only portions related to the present embodiment are shown in FIG. 1. Therefore, the acoustic reproduction device 100 may further include a portion other than the portions shown in FIG. 1.

The processor 110 implements various functions by reading various programs and data stored in the memory 120 and executing a process. The processor 110 may be configured using, for example, a central processing unit (hereinafter, referred to as "CPU"), a micro processing unit (hereinafter, referred to as "MPU"), a digital signal processor (hereinafter, referred to as "DSP"), a graphical processing unit (hereinafter, referred to as "GPU"), or a field programmable gate array (hereinafter, referred to as "FPGA").

The memory 120 is a storage area for storing and holding various types of information. The memory 120 is configured using, for example, a read only memory (hereinafter, referred to as "ROM") which is a nonvolatile storage area, or a random access memory (hereinafter referred to as "RAM") which is a volatile storage area.

The processor 110 cooperates with the memory 120 to implement at least functions of a preamplifier 130, an equalizer 140, and a compressor 150. The configuration of the processor 110 including the preamplifier 130, the equalizer 140, and the compressor 150 is an example, and one part may be divided into a plurality of parts or a plurality of parts may be integrated into one part.

The preamplifier 130 adjusts a volume of a sound of a sound source reproduced by the acoustic reproduction device 100 based on a gain value of the preamplifier 130. Adjustment by the preamplifier 130 may include, for example, amplification of the volume of sound or the like, or attenuation of the volume. The gain value for adjustment may be set in advance. The gain value for adjustment is derived by an acoustic measurement system 200 to be described later in accordance with an acoustic characteristic of the headphone 160. Hereinafter, the gain value of the preamplifier 130 may be referred to as a parameter of the preamplifier 130.

The equalizer 140 corrects a frequency characteristic of the sound of the sound source reproduced by the acoustic reproduction device 100. The equalizer 140 corrects the frequency characteristic of the sound or the like based on a parameter set in accordance with the acoustic characteristic of the headphone 160. Accordingly, the equalizer 140 corrects the acoustic characteristic of the headphone 160 from which the sound or the like is output. The parameter for correction may be set in advance. The parameter for correction is derived by the acoustic measurement system 200 to be described later in accordance with the acoustic characteristic of the headphone 160. In addition, the acoustic characteristic includes, for example, the frequency characteristic.

The compressor 150 adjusts an amplitude of the sound or the like of the sound source reproduced by the acoustic reproduction device 100 to prevent clipping of the sound or the like. For example, in a case where an amplitude of a signal of the sound or the like is equal to or greater than a predetermined threshold, the compressor 150 lowers the amplitude of the signal. For example, parameters of the compressor 150 including a threshold for amplitude adjustment may be set in advance. The parameters of the compressor 150 may be set by, for example, a user such as an administrator of the acoustic reproduction device 100 or the acoustic measurement system 200 to be described later, or may be derived by the acoustic measurement system 200 to be described later. However, the parameters of the compressor 150 are determined regardless of the acoustic characteristic of the headphone 160. In the present embodiment, the compressor 150 may be omitted from the acoustic reproduction device 100.

The sound or the like of the sound source reproduced by the acoustic reproduction device 100 is subjected to various adjustments in the order of the preamplifier 130, the equalizer 140, and the compressor 150, and is then output to the headphone 160.

The headphone 160 outputs the sound or the like of the sound source subjected to various adjustments by the processor 110. For example, a user such as a passenger of an aircraft can listen to the sound or the like output from the headphone 160. The user can listen to the sound or the like of which the sound quality is improved by various adjustments performed by the preamplifier 130, the equalizer 140, and the compressor 150, as compared with a case where the various adjustments are not performed. A type of the headphone 160 connected to the acoustic reproduction device 100 is not limited. The acoustic measurement system to be described later derives various parameters of the preamplifier 130 and the equalizer 140 in accordance with the type of the headphone 160.

[1-1-2. Configuration Example of Acoustic Measurement System]

Figure 2:
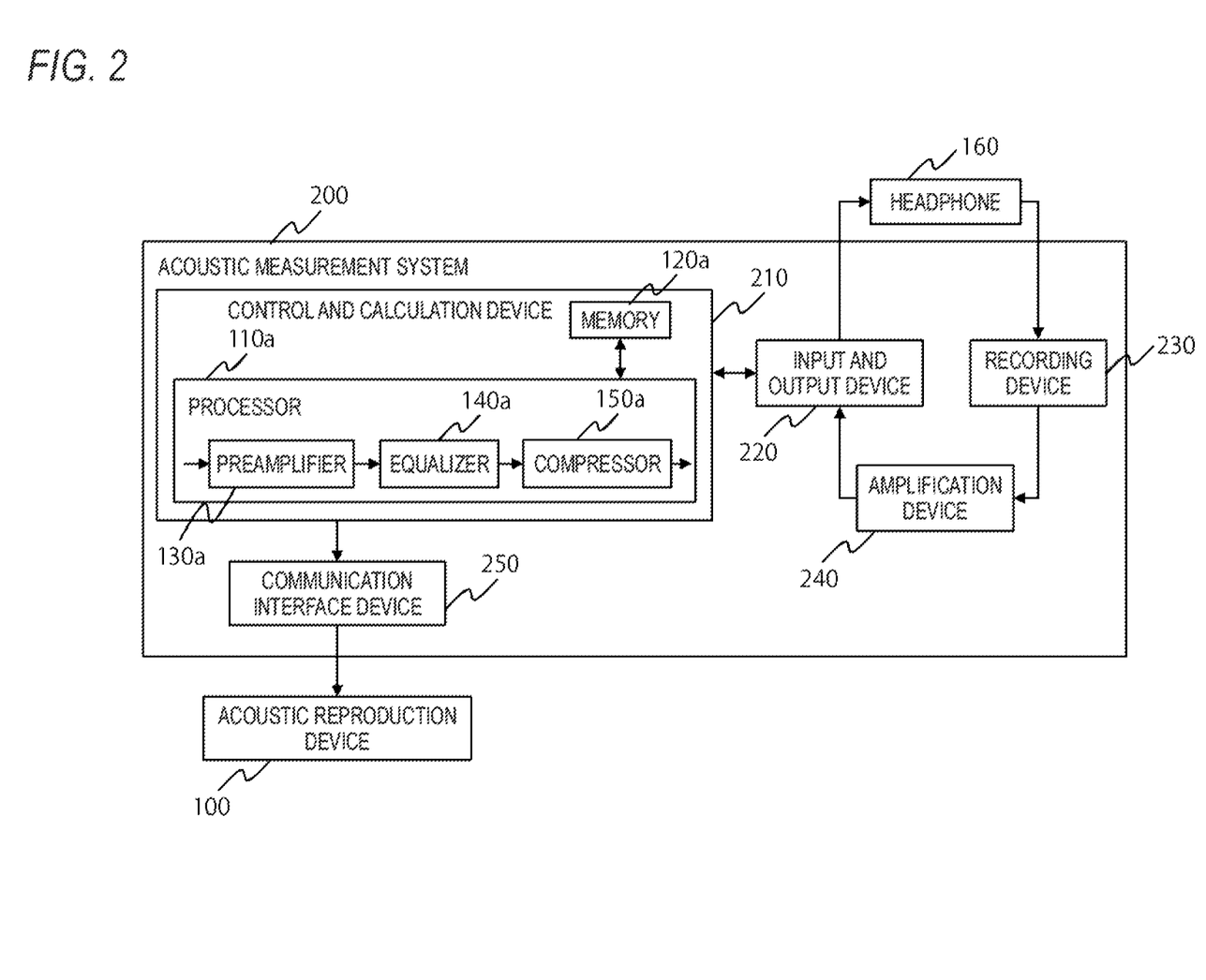
FIG. 2 is a block diagram showing a configuration example of an acoustic measurement system according to the first embodiment.

A configuration example of the acoustic measurement system 200 according to the first embodiment will be described with reference to FIG. 2. FIG. 2 is a block diagram showing the configuration example of the acoustic measurement system 200 according to the first embodiment.

The acoustic measurement system 200 measures the acoustic characteristic of the headphone 160 and derives the gain value of the preamplifier 130 and the parameter of the equalizer 140 based on a measurement result.

The acoustic measurement system 200 includes a control and calculation device 210, an input and output device 220, a recording device 230, an amplification device 240, and a communication interface device 250.

The control and calculation device 210 is a computer such as a personal computer. The control and calculation device 210 includes a processor 110a and a memory 120a. The processor 110a cooperates with the memory 120a to implement at least functions of a preamplifier 130a, an equalizer 140a, and a compressor 150a. Parameters of the preamplifier 130a, the equalizer 140a, and the compressor 150a are applied as parameters of the preamplifier 130, the equalizer 140, and the compressor 150, respectively. Therefore, the parameters of the preamplifier 130, the equalizer 140, and the compressor 150 can be obtained by obtaining the parameters of the preamplifier 130a, the equalizer 140a, and the compressor 150a.

The control and calculation device 210 outputs an output command of a signal for acoustic measurement of the headphone 160 to the input and output device 220. The signal for acoustic measurement is, for example, white noise. In addition, acoustic measurement is synonymous with measurement on the acoustic characteristic. Hereinafter, the signal for acoustic measurement may be referred to as a test sound source.

The input and output device 220 can input and output a signal. The input and output device 220 is, for example, an audio interface. The plug of the headphone 160 is inserted into the input and output device 220. In a case where an output command of the test sound source is received from the control and calculation device 210, the input and output device 220 outputs the test sound source to the headphone 160. The headphone 160 outputs the test sound source.

The recording device 230 may collect and record a sound, and includes, for example, a microphone. The recording device 230 is, for example, head and torso simulators or a dummy head microphone. The headphone 160 is attached to the recording device 230. For example, in a case where the recording device 230 is in a shape of a human head, the headphone 160 is worn in a human ear. The test sound source output from the headphone 160 is received by the recording device 230. The recording device 230 outputs the received test sound source to the amplification device 240.

The amplification device 240 amplifies the input test sound source and outputs the amplified test sound source to the input and output device 220. The amplification device 240 is, for example, a microphone amplifier. The input and output device 220 outputs the test sound source input from the amplification device 240 to the control and calculation device 210. The control and calculation device 210 analyzes the test sound source input from the input and output device 220. Accordingly, the control and calculation device 210 measures the acoustic characteristic of the headphone 160. The control and calculation device 210 derives the gain value of the preamplifier 130a and the parameter of the equalizer 140a based on the measurement result. In addition, the control and calculation device 210 derives the parameter of the compressor 150a regardless of the measurement result of the acoustic characteristic of the headphone 160. The parameter of the compressor 150a may be set by the user. The control and calculation device 210 may derive the parameter of the compressor 150a based on setting by the user relating to the signal of the sound or the like.

The control and calculation device 210 outputs the derived various parameters to the acoustic reproduction device 100 via the communication interface device 250. Connection between the control and calculation device 210 and the communication interface device 250 may be wired communication or wireless communication. The same applies to connection between the communication interface device 250 and the acoustic reproduction device 100. The communication interface device 250 may be, for example, a server.

The acoustic reproduction device 100 applies various parameters derived by the acoustic measurement system 200 to the preamplifier 130, the equalizer 140, and the compressor 150. Accordingly, the acoustic reproduction device 100 can improve the sound quality of the sound or the like output from the headphone 160 connected to the acoustic reproduction device 100.

1-2. Gain Value Calculation Process

Next, a method in which the control and calculation device 210 calculates the gain value for the preamplifier 130 included in the acoustic reproduction device 100 will be described with reference to FIGS. 3 to 5.

Figure 3:
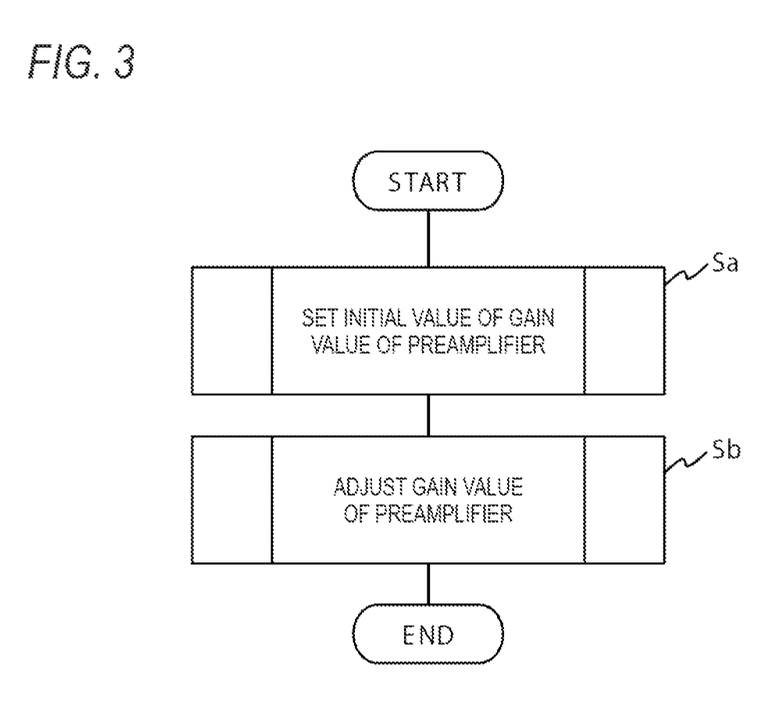
FIG. 3 is a flowchart showing a flow of a process for calculating a gain value of a preamplifier according to the first embodiment.

FIG. 3 is a flowchart showing a flow of a process for calculating the gain value of the preamplifier 130 according to the first embodiment. It is assumed that at the start of the flowchart in FIG. 3, the control and calculation device 210 has already calculated the parameter of the equalizer 140a and the parameter of the compressor 150a.

The gain value of the preamplifier 130 is obtained by the following two steps Sa and Sb. First, in step Sa, the control and calculation device 210 calculates an energy of the test sound source before correction by the equalizer 140a and an energy of the test sound source after correction by the equalizer 140a. The control and calculation device 210 adopts a value obtained by converting a difference in the energies into a decibel value as an initial value of the gain value of the preamplifier 130a.

Next, in step Sb, the control and calculation device 210 sets the initial value as the gain value of the preamplifier 130a. The control and calculation device 210 calculates a loudness value and a clipping occurrence rate of the test sound source adjusted and corrected by the preamplifier 130a, the equalizer 140a, and the compressor 150a. The control and calculation device 210 adjusts the gain value of the preamplifier 130a so that the calculated loudness value and clipping occurrence rate are less than respective thresholds. Here, the respectively set thresholds are different thresholds respectively provided for the loudness value and the clipping occurrence rate, and for example, a first threshold is provided corresponding to the loudness value, and a second threshold is provided corresponding to the clipping occurrence rate. Then, the control and calculation device 210 ends this process flow.

[1-2-1. Initial Value Calculation Process]

The process of step Sa in the flowchart of FIG. 3 will be described with reference to FIG. 4. FIG. 4 is a flowchart showing the initial value calculation process of the gain value of the preamplifier 130a. The control and calculation device 210 calculates the gain value of the preamplifier 130a using N test sound sources. N is an integer of 1 or more. However, N is preferably an integer of 2 or more rather than an integer of 1 or more from the viewpoint of ensuring the reliability of the calculation result of the gain value of the preamplifier 130a by the control and calculation device 210. In this flowchart, the control and calculation device 210 focuses on the i-th test sound source among the N test sound sources and performs calculation. Here, i is an integer of 1 or more and N or less.

The control and calculation device 210 focuses on the first test sound source (step Sa1). The process of step Sa1 is shown in Equation (1). Hereinafter, for convenience of description, it is assumed that the control and calculation device 210 focuses on the i-th test sound source $x_i$.

$$i \leftarrow 1 \tag{1}$$

The control and calculation device 210 performs fast Fourier transform (hereinafter, referred to as "FFT") on the test sound source $x_i$ to calculate a frequency characteristic $X_i$ (step Sa2). The process of step Sa2 is shown in Equation (2).

$$X_i \leftarrow \text{FFT}[x_i] \tag{2}$$

The control and calculation device 210 performs a process of multiplying the frequency characteristic $X_i$ calculated in step Sa2 by a frequency characteristic $H_K$ of a filter that takes into account an acoustic effect and an auditory characteristic of a human head, which is called a K filter, as disclosed in ITU-R BS. 1770 (step Sa3). The process in step Sa3 is shown in Equation (3). Accordingly, $Y_i$ obtained by multiplying the frequency characteristic of the K filter by the frequency characteristic of the focused test sound source is obtained. $Y_i$ means the frequency characteristic of the test sound source subjected to a K filter passing process.

$$Y_i \leftarrow H_K \times X_i \tag{3}$$

The control and calculation device 210 calculates an energy of the test sound source based on the frequency characteristic of the test sound source subjected to the K filter passing process calculated in step Sa3 (step Sa4). The process in step Sa4 is shown in Equation (4).

$$E_i \leftarrow \text{sum}(|Y_i|^2) \quad (4)$$

The control and calculation device 210 performs a process of multiplying the frequency characteristic $Y_i$ of the test sound source subjected to the K filter passing process calculated in step Sa3 by a frequency characteristic $H_{EQ}$ of the equalizer 140a in accordance with the acoustic characteristic of the headphone 160 (step Sa5). Here, the frequency characteristic $H_{EQ}$ of the equalizer 140a in accordance with the acoustic characteristic of the headphone 160 is a parameter for correction by the equalizer 140a, and is calculated in advance. The process in step Sa5 is shown in Equation (5). Accordingly, $Y_{i,EQ}$ obtained by multiplying the test sound source subjected to the K filter passing process by the frequency characteristic of the equalizer 140a is obtained. $Y_{i,EQ}$ means the frequency characteristic of the test sound source subjected to correction by the equalizer 140a.

$$Y_{i,EQ} \leftarrow H_{EQ} \times Y_i \quad (5)$$

The control and calculation device 210 calculates the energy of the test sound source based on the frequency characteristic of the test sound source subjected to an equalizer correction process calculated in step Sa5 (step Sa6). The process in step Sa6 is shown in Equation (6).

$$E_{i,EQ} \leftarrow \text{sum}(|Y_{i,EQ}|^2) \quad (6)$$

The control and calculation device 210 calculates a difference between the energy of the test sound source after the equalizer correction process calculated in step Sa6 and the energy of the test sound source before the equalizer correction process calculated in step Sa4, and converts the difference into a decibel value (step Sa7). The process in step Sa7 is shown in Equation (7).

$$R_i \leftarrow 10 \log_{10}\left(\frac{E_i}{E_{i,EQ}}\right) \quad (7)$$

The control and calculation device 210 determines whether the focused test sound source is the N-th test sound source (step Sa8). The equation used for the determination in step Sa8 is shown in Equation (8).

$$i = N \quad (8)$$

In a case where the focused test sound source is not the N-th test sound source (step Sa8; No), the control and calculation device 210 focuses on the (i+1)-th test sound source (step Sa9). Thereafter, the process of the control and calculation device 210 returns to step Sa2 and repeats the process. The process in step Sa9 is shown in Equation (9). Accordingly, each of the arithmetic processes from step Sa2 to step Sa7 can be executed for all of the N test sound sources from the first test sound source (see step Sa1) to the N-th test sound source. In other words, each of the arithmetic processes from step Sa2 to step Sa7 is repeated N times.

$$i \leftarrow i+1 \quad (9)$$

In a case where the focused test sound source is the N-th test sound source (step Sa8; Yes), the control and calculation device 210 uses, as the initial value of the gain value of the preamplifier 130a, a value obtained by rounding the maximum value of N decibel values obtained by executing the process of step Sa7 on the N test sound sources into an integer (step Sa10). Then, the control and calculation device 210 ends this process flow. The process in step Sa10 is shown in Equation (10).

$$G \leftarrow \text{round}(\max(R_i)) \quad (10)$$

Figure 4:
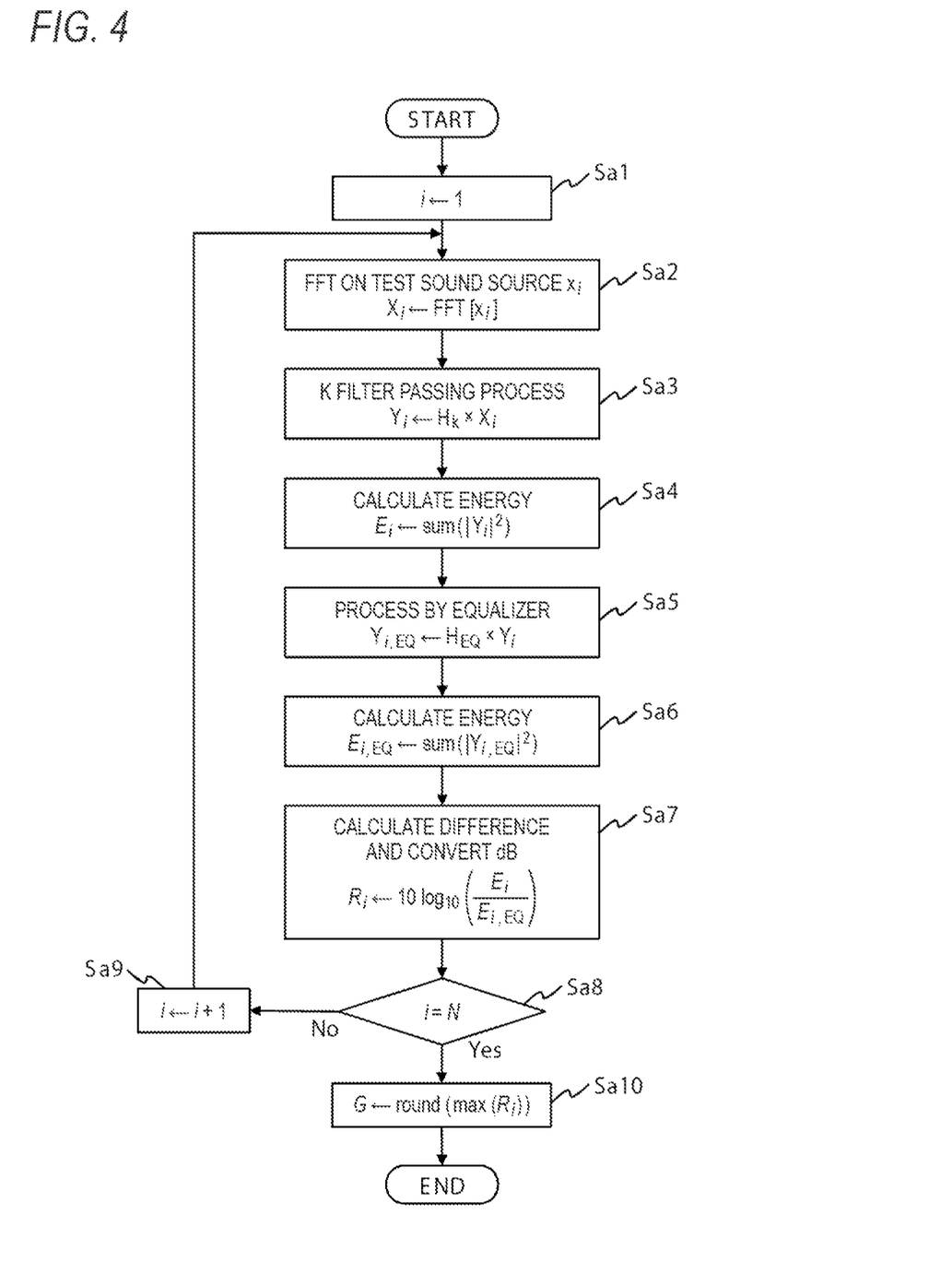
FIG. 4 is a flowchart showing an initial value calculation process of the gain value of the preamplifier according to the first embodiment.

By using the gain value of the preamplifier 130a obtained by the series of processes of the flowchart shown in FIG. 4, it is possible to prevent a decrease in the volume feeling obtained by the user of the acoustic reproduction device 100 when the user listens to the sound source corrected by the equalizer 140. In other words, by the series of processes of the flowchart shown in FIG. 4, the volume feelings of the sound source before and after the correction by the equalizer 140 can be equalized as much as possible.

[1-2-2. Gain Value Adjustment Process]

The process of step Sb in the flowchart of FIG. 3 will be described with reference to FIG. 5. FIG. 5 is a flowchart showing an adjustment process of the gain value of the preamplifier 130a. It is assumed that the series of processes shown in FIG. 4 is completed at the start of the flowchart of FIG. 5. The control and calculation device 210 adjusts the gain value of the preamplifier 130a using the N test sound sources used in the processes of the flowchart shown in FIG. 4. In this flowchart, the control and calculation device 210 focuses on the j-th test sound source among the N test sound sources and performs calculation. Here, j is an integer of 1 or more and N or less.

The control and calculation device 210 focuses on the first test sound source (step Sb1). The process in step Sb1 is shown in Equation (11). Hereinafter, for convenience of description, it is assumed that the control and calculation device 210 focuses on the j-th test sound source $x_j$.

$$j \leftarrow 1 \quad (11)$$

The control and calculation device 210 sets, as a gain value G of the preamplifier 130a, the initial value of the gain value of the preamplifier 130a adopted in step Sa10 of the flowchart of FIG. 4. The control and calculation device 210 executes a process shown in Equation (12) based on the set gain value G and the frequency characteristic $H_{EQ}$ of the equalizer 140a in accordance with the acoustic characteristic of the headphone 160 (step Sb2).

$$H_{G,EQ} \leftarrow G + H_{EQ} \quad (12)$$

The control and calculation device 210 performs a correction and adjustment process on the test sound source $x_j$ by the preamplifier 130a, the equalizer 140a, and the compressor 150a (step Sb3). The process of step Sb3 is shown in Equation (13). Accordingly, a test sound source $x_{j,EQ}$ subjected to correction and adjustment is obtained.

$$x_{j,EQ} \leftarrow EQ[x_j, H_{G,EQ}] \tag{13}$$

The control and calculation device 210 calculates a loudness value Loudness $[x_{j,EQ}]$ of the test sound sources $x_{j,EQ}$ by using the method disclosed in ITU-R BS. 1770, and determines whether a calculation result of the loudness value is less than a predetermined first threshold ηL of the loudness value which is defined in advance (step Sb4). The equation used for the determination in step Sb4 is shown in Equation (14). The first threshold may be calculated in advance by the control and calculation device 210 and stored in the memory 120a, or may be set by the user.

$$\text{Loudness}[x_{j,EQ}] < \eta_L \tag{14}$$

In a case where the calculation result of the loudness value is not less than the predetermined first threshold (step Sb4; No), the control and calculation device 210 updates the gain value G of the preamplifier 130a to a value obtained by subtracting 1 decibel (step Sb5). The initial value of the gain value G is the initial value of the gain value of the preamplifier 130a adopted in step Sa10 of the flowchart of FIG. 4. The process of step Sb5 is shown in Equation (15). Thereafter, the process of the control and calculation device 210 returns to step Sb2 and repeats the process. Briefly speaking, the loudness value is a value of a volume of sound that a human feels. Therefore, the control and calculation device 210 can prevent an excessively large sound from reaching the user by the processes of steps Sb4 and Sb5. For example, in a case where it is defined that the loudness value of the sound or the like reproduced on the monitor in the aircraft is less than a predetermined value, the loudness value can be adjusted by the processes of steps Sb4 and Sb5.

$$G \leftarrow G - 1 \tag{15}$$

In a case where a calculation result of the loudness value is less than the predetermined first threshold (step Sb4; Yes), the control and calculation device 210 calculates the clipping occurrence rate of the test sound source $x_{j,EQ}$ (step Sb6). In step Sb6, the control and calculation device 210 executes the process shown in Equation (16) and calculates an average value $P_{j,all}$ of the clipping occurrence rates over the entire reproduction period of the test sound source $x_{j,EQ}$. In step Sb6, the control and calculation device 210 further executes the process shown in Equation (17) and calculates a clipping occurrence rate $P_{j,mov}$ for each moving average of the set time of the test sound source $x_{j,EQ}$. The set time may be defined by the user in advance. In the example of FIG. 5, the set time is 0.1 seconds.

$$P_{j,all} \leftarrow \text{mean}(S_j) \tag{16}$$

$$P_{j,mov} \leftarrow \text{movmean}(S_j, 0.1 \text{ sec}) \tag{17}$$

The control and calculation device 210 determines whether a calculation result of the average value $P_{j,all}$ of the clipping occurrence rates calculated in step Sb6 is less than a predetermined third threshold $\eta_{all}$ (step Sb7). The equation used for the determination in step Sb7 is shown in Equation (18). The third threshold may be calculated in advance by the control and calculation device 210 and stored in the memory 120a, or may be set by the user.

$$P_{j,all} < \eta_{all} \tag{18}$$

In a case where the average value of the clipping occurrence rates is not less than the predetermined third threshold (step Sb7; No), the control and calculation device 210 updates the gain value G of the preamplifier 130a to a value obtained by subtracting 1 decibel (step Sb5). Thereafter, the process of the control and calculation device 210 returns to step Sb2 and repeats the process.

In a case where the calculation result of the average value of the clipping occurrence rates over the entire reproduction period of the test sound source is less than the predetermined third threshold (Step Sb7; Yes), the control and calculation device 210 determines whether the calculation result of the clipping occurrence rate $P_{j,mov}$ for each moving average calculated in step Sb6 is less than a predetermined fourth threshold $\eta_{mov}$ (Step Sb8). The equation used for the determination in step Sb8 is shown in Equation (19). The fourth threshold may be calculated in advance by the control and calculation device 210 and stored in the memory 120a, or may be set by the user.

$$\max(P_{j,mov}) < \eta_{mov} \tag{19}$$

In a case where the calculation result of the clipping occurrence rate for each moving average is not less than the predetermined fourth threshold (step Sb8; No), the control and calculation device 210 updates the gain value G of the preamplifier 130a to a value obtained by subtracting 1 decibel (step Sb5). Thereafter, the process of the control and calculation device 210 returns to step Sb2 and repeats the process.

In a case where the calculation result of the clipping occurrence rate for each moving average is less than the predetermined fourth threshold (step Sb8; Yes), the control and calculation device 210 proceeds to the process of step Sb9. As described in the step Sb6, the control and calculation device 210 calculates the average value of the clipping occurrence rates over the entire reproduction period of the test sound source and the clipping occurrence rate for each moving average of the set time in the test sound source. In addition, the predetermined third threshold is set for the average value of the clipping occurrence rates over the entire reproduction period of the test sound source. In addition, the predetermined fourth threshold is set for the clipping occurrence rate for each moving average of the set time in the test sound source. The control and calculation device 210 can adjust, by the processes of steps Sb7, Sb8, and Sb5, the gain value of the preamplifier 130a to a value capable of reducing the clipping occurrence rate.

The control and calculation device 210 determines whether the focused test sound source is the N-th test sound source (step Sb9). The equation used for the determination in step Sa9 is shown in Equation (20).

$$j=N \tag{20}$$

In a case where the focused test sound source is not the N-th test sound source (step Sb9; No), the control and calculation device 210 focuses on the (j+1)-th test sound source (step Sb10). Thereafter, the process of the control and calculation device 210 returns to step Sb3 and repeats the process. The process of step Sb10 is shown in Equation (21).

$$j \leftarrow j+1 \tag{21}$$

In a case where the focused test sound source is the N-th test sound source (step Sb9; Yes), the control and calculation device 210 adopts a gain value set at a current time point as a final gain value, and ends this process flow. In this way, the control and calculation device 210 repeats the adjustment of the gain value so that the determination results in steps Sb4, Sb7, and Sb8 become all "Yes" for all of the N test sound sources from the first test sound source (see step Sb1) to the N-th test sound source.

For example, in a case where all the determination results in steps Sb4, Sb7, and Sb8 are "Yes" for the first test sound source, the gain value remains the initial value. However, in a case where the determination result in step Sb4 is "No" for the second test sound source, the control and calculation device 210 reduces the gain value by 1 decibel from the initial value. The control and calculation device 210 decreases the gain value by 1 decibel for the second test sound source until the determination results in steps Sb4, Sb7, and Sb8 become all "Yes". The control and calculation device 210 executes the same process for the third and subsequent test sound sources. For example, in a case where there are ten or more test sound sources, the gain value may not be decreased by 1 decibel in a series of processes for the fifth test sound source. On the other hand, the gain value may also be decreased by 3 decibels in total in a series of processes for the tenth test sound source. In a case where all the determination results in step Sb4, step Sb7, and step Sb8 for the N-th test sound source are "Yes", the control and calculation device 210 adopts a gain value at that time point as the gain value to be output to the acoustic reproduction device 100.

The control and calculation device 210 outputs, to the acoustic reproduction device 100, the gain value of the preamplifier 130a finally adopted, the parameter of the equalizer 140a calculated in advance, and the parameter of the compressor 150a. The acoustic reproduction device 100 applies the acquired various parameters to the preamplifier 130, the equalizer 140, and the compressor 150. Accordingly, when the user of the acoustic reproduction device 100 listens to the sound source corrected by the equalizer 140, it is possible not only to prevent a decrease in the volume feeling obtained by the user, but also to reduce the occurrence rate of clipping that may occur due to the correction by the equalizer 140.

1-3. Effects

The headphone 160 is, for example, a headphone distributed to a passenger of an economy class in an aircraft. Since most of such headphones are inexpensive in many cases, the frequency characteristic of the headphone deviates from an ideal frequency characteristic in many cases. For example, the frequency characteristic of the headphone 160 has an extreme peak or an extreme dip. However, the peak may cause clipping. In addition, the dip may cause a decrease in the volume feeling obtained by the user.

Figure 6:
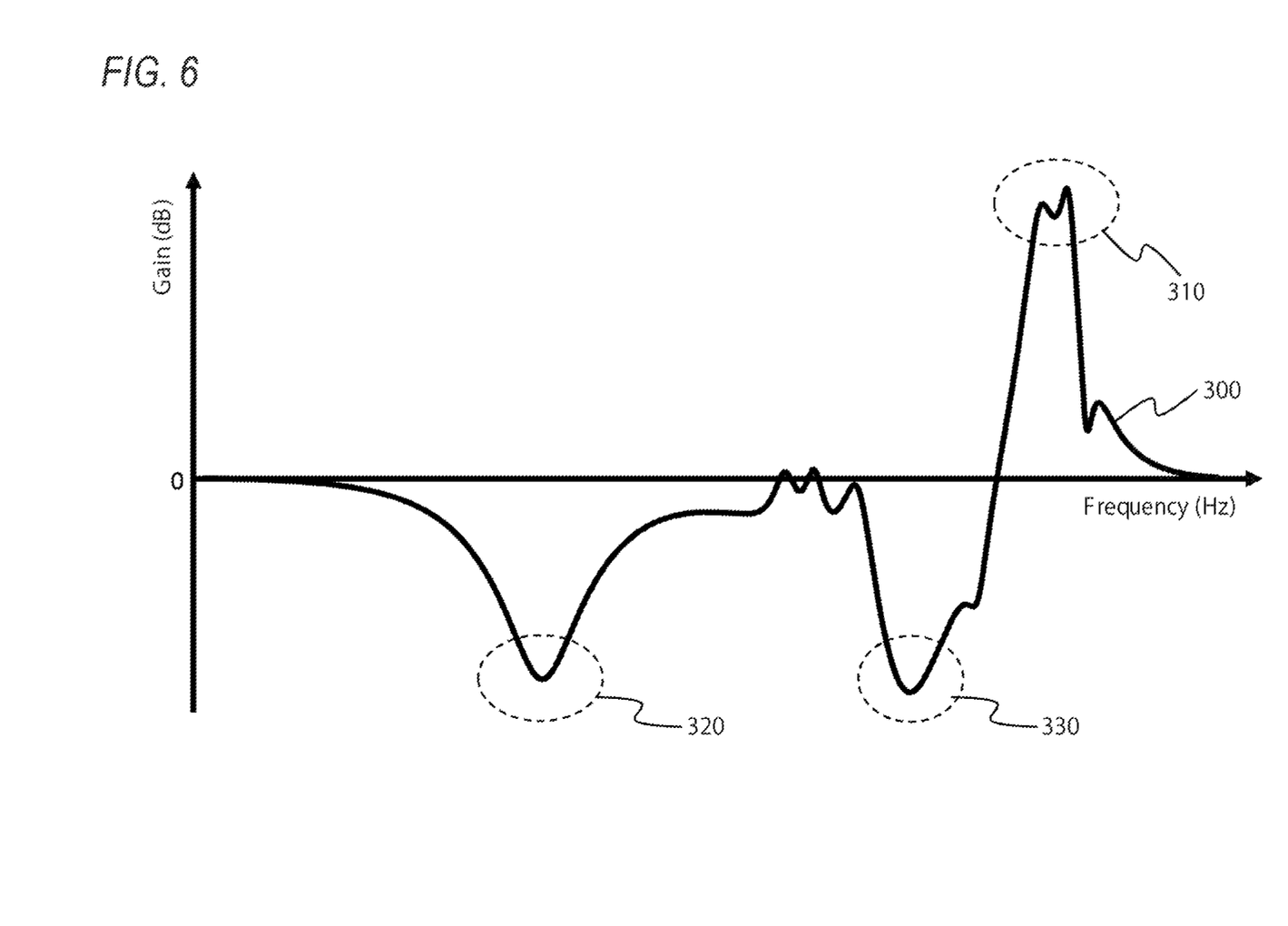
FIG. 6 is a graphic diagram showing an example of a frequency characteristic of an equalizer for correcting an acoustic characteristic of a headphone according to the first embodiment.

FIG. 6 is a graphic diagram showing an example of the frequency characteristic of the equalizer 140 that corrects the acoustic characteristic of the headphone 160 according to the first embodiment. In FIG. 6, a vertical axis represents the gain value, and a horizontal axis represents the frequency. The frequency characteristic of the equalizer 140 shown in a graph 300 has a peak 310, a dip 320, and a dip 330. The frequency characteristic of the equalizer 140 is derived by the control and calculation device 210 in accordance with the headphone 160.

Figure 7:
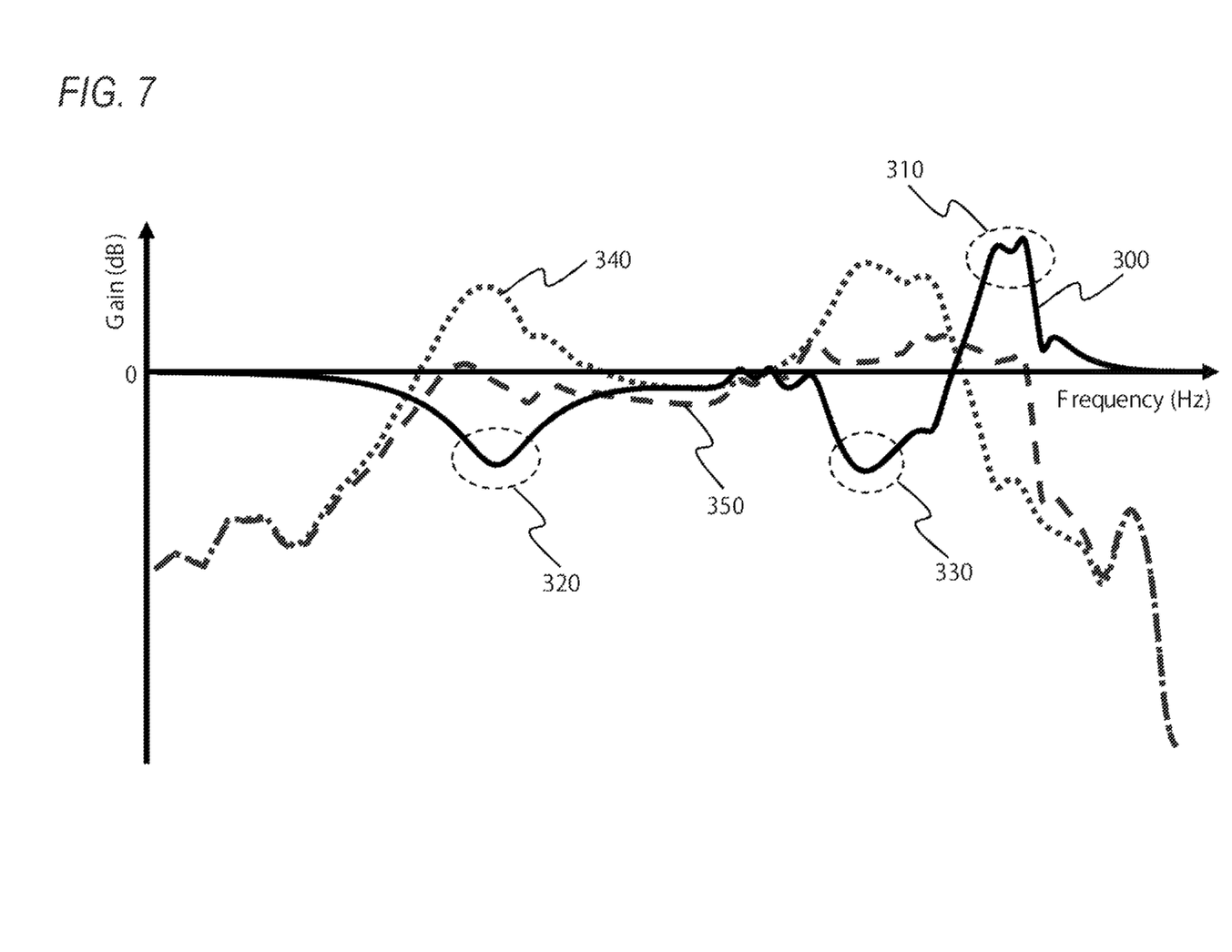
FIG. 7 is a graphic diagram showing an example of correction of the acoustic characteristic of the headphone by the equalizer according to the first embodiment.

FIG. 7 shows the frequency characteristic of the headphone 160 corrected by the equalizer 140. FIG. 7 is a graphic diagram showing an example of correction of the acoustic characteristic of the headphone 160 by the equalizer 140 according to the first embodiment. In FIG. 7, a vertical axis represents the gain value, and a horizontal axis represents the frequency. A graph 340 is the frequency characteristic of the headphone 160 before correction by the equalizer 140. A graph 350 is the frequency characteristic of the headphone 160 after correction by the equalizer 140. The graph 340 has a dip at a frequency near the peak 310. In addition, the graph 340 has a peak at each of a frequency near the dip 320 and a frequency near the dip 330. As shown in the graph 350, the dip and the two peaks of the graph 340 are further reduced to the peak 310, the dip 320, and the dip 330 of the graph 300. In the graphic diagrams shown in FIGS. 6 and 7, a frequency range may be, for example, 20 Hz to 20 KHz.

In the acoustic reproduction device 100, adjustment of the sound or the like by the preamplifier 130 is performed before correction by the equalizer 140. The preamplifier 130 executes adjustment of the sound or the like using the gain value obtained by the method described with reference to FIGS. 3, 4, and 5. Accordingly, by correcting the acoustic characteristic of the headphone 160 by the equalizer 140 as in the example of FIG. 7, it is possible to prevent a decrease in the volume feeling obtained by the user of the acoustic reproduction device 100, and to prevent clipping that may occur by the correction executed by the equalizer 140.

1-4. Modification

In the above first embodiment, an example is shown in which the preamplifier 130, the equalizer 140, and the compressor 150 function as software. But without being limited thereto, the preamplifier 130, the equalizer 140, and the compressor 150 may be implemented as hardware.

In addition, the compressor 150 and the compressor 150a may be omitted in the acoustic reproduction device 100 and the acoustic measurement system 200.

In addition, in the first embodiment, the acoustic reproduction device 100 includes the processor 110, the memory 120, and the jack into which the plug of the headphone 160 can be inserted. But without being limited thereto, a plurality of devices may cooperate with one another to implement the function of the acoustic reproduction device 100. For example, a device including the processor 110 and the memory 120 and a device including the jack into which the plug of the headphone 160 can be inserted may cooperate with each other to implement the function as the acoustic reproduction device 100.

In addition, in the first embodiment, it is described on the premise that the headphone 160 has a plug and is wire-connected. But without being limited thereto, the headphone 160 may be a device capable of wireless connection using Bluetooth (registered trademark) or the like such as a wireless headphone or a wireless earphone.

In addition, in steps Sa4 and Sa6 of the flowchart shown in FIG. 4, the control and calculation device 210 calculates an energy in a frequency domain. But without being limited thereto, the control and calculation device 210 may calculate an energy in a time domain. In addition, the control and calculation device 210 may calculate the loudness value by a method disclosed in ITU-R BS. 1770, instead of calculating an energy. In addition, the control and calculation device 210 may convert a difference in the loudness value into a decibel value, instead of a difference in the energy.

Figure 5:
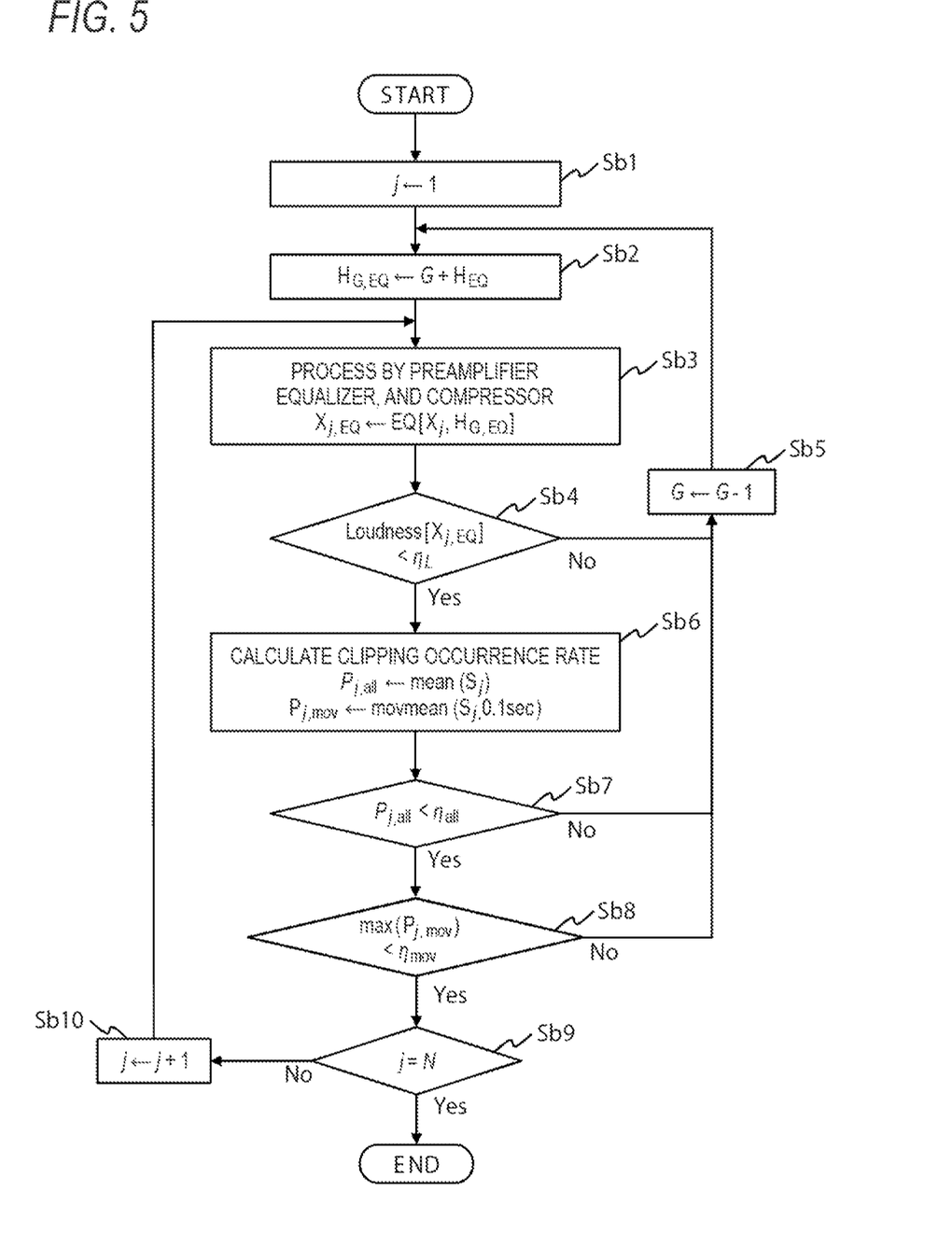
FIG. 5 is a flowchart showing an adjustment process of the gain value of the preamplifier according to the first embodiment.

In addition, in step Sb6 of the flowchart shown in FIG. 5, the set time is described as 0.1 seconds, but it is not intended to be limited thereto. For example, the set time may be 0.2 seconds or 0.5 seconds.

In addition, in step Sb5 of the flowchart shown in FIG. 5, an example is shown in which the control and calculation device 210 decreases the gain value by 1 decibel. But without being limited thereto, for example, the control and calculation device 210 may decrease the gain value by 2 decibels in step Sb5. A decrease amount of the gain value in step Sb5 may be set in advance by the user.

In addition, in step Sb6 of the flowchart shown in FIG. 5, an example is shown in which the control and calculation device 210 calculates the average value of the clipping occurrence rates over the entire reproduction period of the test sound source and determines whether the calculation result of the average value is less than the predetermined third threshold. In addition, an example is shown in which the control and calculation device 210 calculates the clipping occurrence rate for each moving average of the set time in the test sound source and determines whether the calculation result of the clipping occurrence rate for each moving average of the set time is less than the predetermined fourth threshold. But without being limited thereto, for example, the control and calculation device 210 may determine whether a comprehensive clipping occurrence rate including the calculation result of the average value of the clipping occurrence rates over the entire reproduction period of the test sound source and the clipping occurrence rate for each moving average of the set time in the test sound source is less than the predetermined second threshold. In other words, the control and calculation device 210 may set the second threshold for the clipping occurrence rate calculated by any calculation method. In a case where the clipping occurrence rate calculated by any calculation method is not less than the predetermined second threshold, the control and calculation device 210 may decrease the gain value of the preamplifier 130a by a specified value.

SUMMARY OF PRESENT DISCLOSURE

The following techniques are disclosed according to the above description of the first embodiment.
<Technique 1>
Accordingly, it is possible to decrease a gain value of a preamplifier in order to prevent occurrence of clipping and decrease in volume feeling. Accordingly, it is possible to improve a sound quality by an equalizer while preventing occurrence of clipping and decrease in volume feeling.
<Technique 2>
Accordingly, it is possible to repeatedly decrease a gain value of a preamplifier in order to prevent occurrence of clipping and decrease in volume feeling.
<Technique 3>
Accordingly, a clipping occurrence rate can be further reduced.
<Technique 4>
Accordingly, a gain value of a preamplifier can be adjusted using N test sound sources.

<Technique 5>
Accordingly, a gain value of a preamplifier can be adjusted based on adjustment of an amplitude of a test sound source by a compressor.
<Technique 6>
Accordingly, a gain value of a preamplifier can be adjusted so that a loudness value is less than a defined decibel value.

Although the first embodiment has been described above with reference to the drawings, it is needless to say that the present disclosure is not limited to such examples. It is apparent to those skilled in the art that various changes, corrections, substitutions, additions, deletions, and equivalents can be conceived within the scope of the claims, and it should be understood that such changes, corrections, substitutions, additions, deletions, and equivalents also fall within the technical scope of the present disclosure. In addition, components in the first embodiment described above may be combined freely in a range without deviating from the spirit of the invention.

The present disclosure is useful as a method for acoustic adjustment capable of improving a sound quality by an equalizer while preventing occurrence of clipping and decrease in volume feeling.

What is claimed is:

1. A method for acoustic adjustment, which is executed by an arithmetic device including at least a preamplifier and an equalizer, the method comprising:
    setting an initial value of a gain value of the preamplifier based on a difference between energy of a test sound source before correction by the equalizer and energy of the test sound source after correction by the equalizer;
    amplifying a volume of the test sound source by the preamplifier using the initial value, calculating a loudness value and a clipping occurrence rate of the test sound source after a frequency characteristic of the test sound source is corrected by the equalizer, and determining whether a calculation result of the loudness value is less than a first threshold and whether a calculation result of the clipping occurrence rate is less than a second threshold; and
    reducing the initial value of the gain value by a specified value when the calculation result of the loudness value is equal to or greater than the first threshold or the calculation result of the clipping occurrence rate is equal to or greater than the second threshold.

2. The method for acoustic adjustment according to claim 1, wherein
    the reducing comprises reducing the initial value of the gain value by 1 decibel repeatedly until the calculation result of the loudness value becomes less than the first threshold or the calculation result of the clipping occurrence rate becomes less than the second threshold.

3. The method for acoustic adjustment according to claim 1, wherein
    the clipping occurrence rate includes:
        an average value of clipping occurrence rates over an entire reproduction period of the test sound source; and
        a clipping occurrence rate for each set time calculated as a moving average of the set time of the test sound source, and
    the method for acoustic adjustment further comprises:
    determining whether the average value of clipping occurrence rates is less than a third threshold and whether the clipping occurrence rate for each set time is less than a fourth threshold.

4. The method for acoustic adjustment according to claim 1, wherein
there are N number of test sound sources, and
the method for acoustic adjustment further comprises:
determining whether the loudness value of all of the N number of test sound sources is less than the first threshold and whether the clipping occurrence rate of all of the N number of test sound sources is less than the second threshold.

5. The method for acoustic adjustment according to claim 1, wherein
the arithmetic device further includes a compressor,
the method for acoustic adjustment further comprises correcting the frequency characteristic of the test sound source by the equalizer, and
the calculating comprises calculating the loudness value and the clipping occurrence rate of the test sound source after an amplitude of the test sound source is adjusted by the compressor.

6. The method for acoustic adjustment according to claim 1, further comprising:
determining whether the clipping occurrence rate is less than the second threshold in a case where the loudness value is less than the first threshold.

\* \* \* \* \*